United States Patent [19]
Amamiya

[11] Patent Number: 6,087,684
[45] Date of Patent: Jul. 11, 2000

[54] BIPOLAR TRANSISTOR

[75] Inventor: Yasushi Amamiya, Tokyo, Japan

[73] Assignee: NEC Corporation, Tokyo, Japan

[21] Appl. No.: 09/116,567

[22] Filed: Jul. 16, 1998

[30] Foreign Application Priority Data

Jul. 16, 1997 [JP] Japan ................................. 9-191195

[51] Int. Cl.[7] ...................... H01L 31/072; H01L 31/109; H01L 27/082
[52] U.S. Cl. ............................................ 257/197; 257/198
[58] Field of Search ..................................... 257/197, 198

[56] References Cited

U.S. PATENT DOCUMENTS

| | | |
|---|---|---|
| 4,929,997 | 5/1990 | Honjo et al. . |
| 5,160,994 | 11/1992 | Shimawaki . |
| 5,329,144 | 7/1994 | Larye . |
| 5,494,836 | 2/1996 | Imai . |
| 5,506,427 | 4/1996 | Imai . |
| 5,552,617 | 9/1996 | Hill et al. . |

Primary Examiner—Stephen D. Meier
Attorney, Agent, or Firm—Young & Thompson

[57] ABSTRACT

A heterojunction bipolar transistor (HBT) has shortened electron transport time through collector region over wide range of biased conditions. The HBT is expected to exhibit enhanced high frequency characteristics. In operation under biased condition, a portion of an n-GaAs collector layer makes a depletion region. A p-GaAs base contact layer is in contact with side surface of the depletion region. Even if the collector layer remains in the n-type, the contour of band potential in conduction band of the collector depletion region is adjusted to a desired one by controlling electric potential of the base contact layer. As a result, the band potential with smooth slope is created in the collector depletion region, shortening transport time through the collector layer. The intrinsic portion of the collector layer is of the n-type so that occurrence of Kirk effect is suppressed, ensuring enhanced high frequency characteristics.

8 Claims, 12 Drawing Sheets

5" INSULATED REGION
5' COLLECTOR DEPLETION REGION

6,087,684

BIPOLAR TRANSISTOR

FIELD OF THE INVENTION

The present invention relates to bipolar transistors and more particularly to heterojunction bipolar transistors.

BACKGROUND OF THE INVENTION

Among bipolar transistors (BTs), application of AlGaAs/GaAs heterojunction bipolar transistor (HBT) to digital devices or circuits for micrometer wave and/or millimeter wave communication is expected because of its ultra high-speed operation.

Further increase in operation speed of HBT requires shortening of electron transit time. Attention is to be paid that electron transport time through a collector depletion region occupies a great proportion of electron transit time. Thus, shortening of the electron transport time is particularly required. FIG. 8 shows a representative band diagram of a conventional npn HBT.

As readily seen from the band diagram, electrons gain energy from base-collector depletion region where, under biased condition, high electric field builds up. The field-assisted electrons transfer to higher energy valley with larger effective mass, for example, L valley, resulting in an increase in effective mass. Reduction in mobility results. Thus, it is required to suppress the intensity of electric field to a level weak enough to prevent the transfer of electrons. According to one conventional proposal, fabricating a collector layer of HBT with semiconductor having the p-conductive type lowers the intensity of electric field across base-collector interface as shown in FIG. 9. As shown in FIG. 10, according to another conventional proposal, the intensity of electric field is lowered by fabricating a collector layer with semiconductors having i-conductive type and p-conductive type to alter band diagram of the collector layer.

According to the conventional proposals, impurity concentration in the collector layer changes from the usual n-conductive type to i-conductive type and p-conductive type so as to shift peak of intensity of electric field from the base-collector interface to the sub-collector side. However, in the case of npn HBT, the modification of impurity distribution in collector layer causes undesired device characteristics because the collector layer is usually of the n-conductive type. For high speed operation, it is desired to maintain injection of high concentration of current to shorten time required for charging emitter. However, in the case of collector that is not doped sufficiently with n-conductive type material, injection of high concentration of current into the collector brings about Kirk effect, thereby failing to accomplish desired level of high speed operation of HBT. In summary, even if a complicated, in structure, collector layer is employed to accomplish a desired contour of band diagram, an actual contour of band diagram is subject to an unexpected deviation from the desired contour during operation of HBT due mainly to occurrence of Kirk effect.

SUMMARY OF THE INVENTION

According to the present invention, a bipolar transistor comprises:

a semi-insulating substrate;

an emitter layer of a first semiconductor with a first conductive type;

a base layer of a second semiconductor with a second conductive type;

a collector layer of a third semiconductor with said first conductive type;

a base electrode; and a base contact layer between a base electrode and said base layer, said base contact layer being formed of a fourth semiconductor with said second conductive type;

said base contact layer being in contact with a depletion region formed between said base layer and said collector layer under biased condition.

DESCRIPTION OF THE PREFERRED EMBODIMENTS

Figure 11:
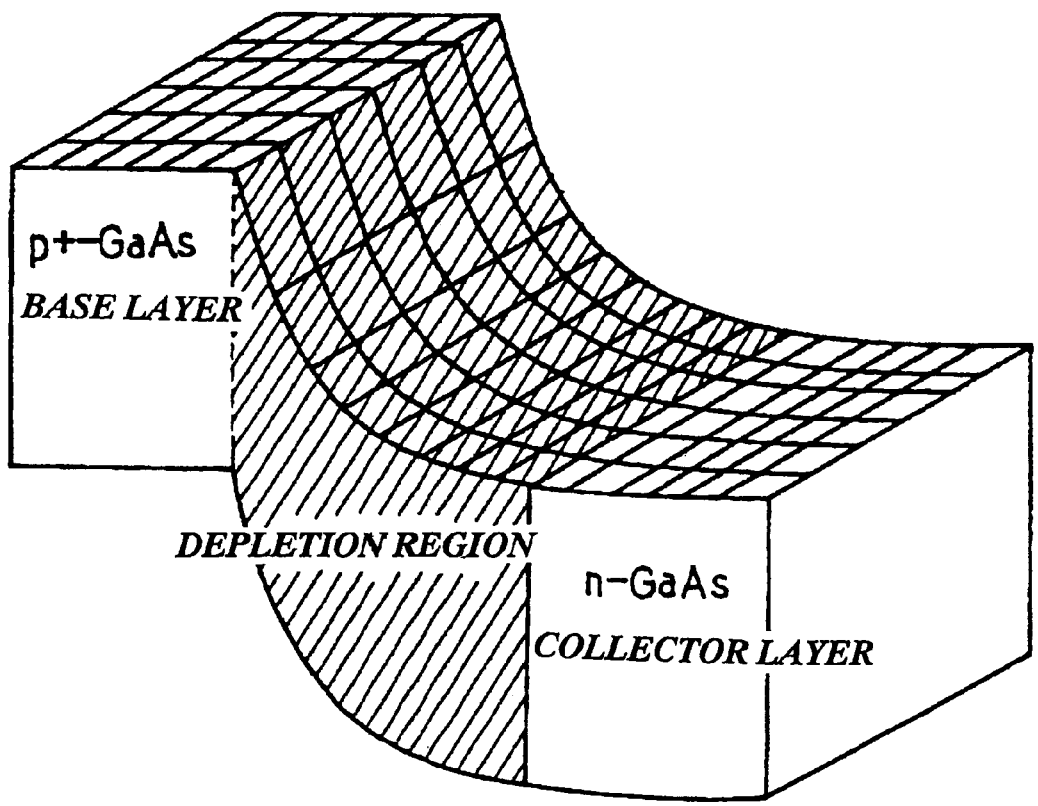
FIG. 11 is a diagram of contour of energy band in base collector region of the conventional HBT.
Figure 12:
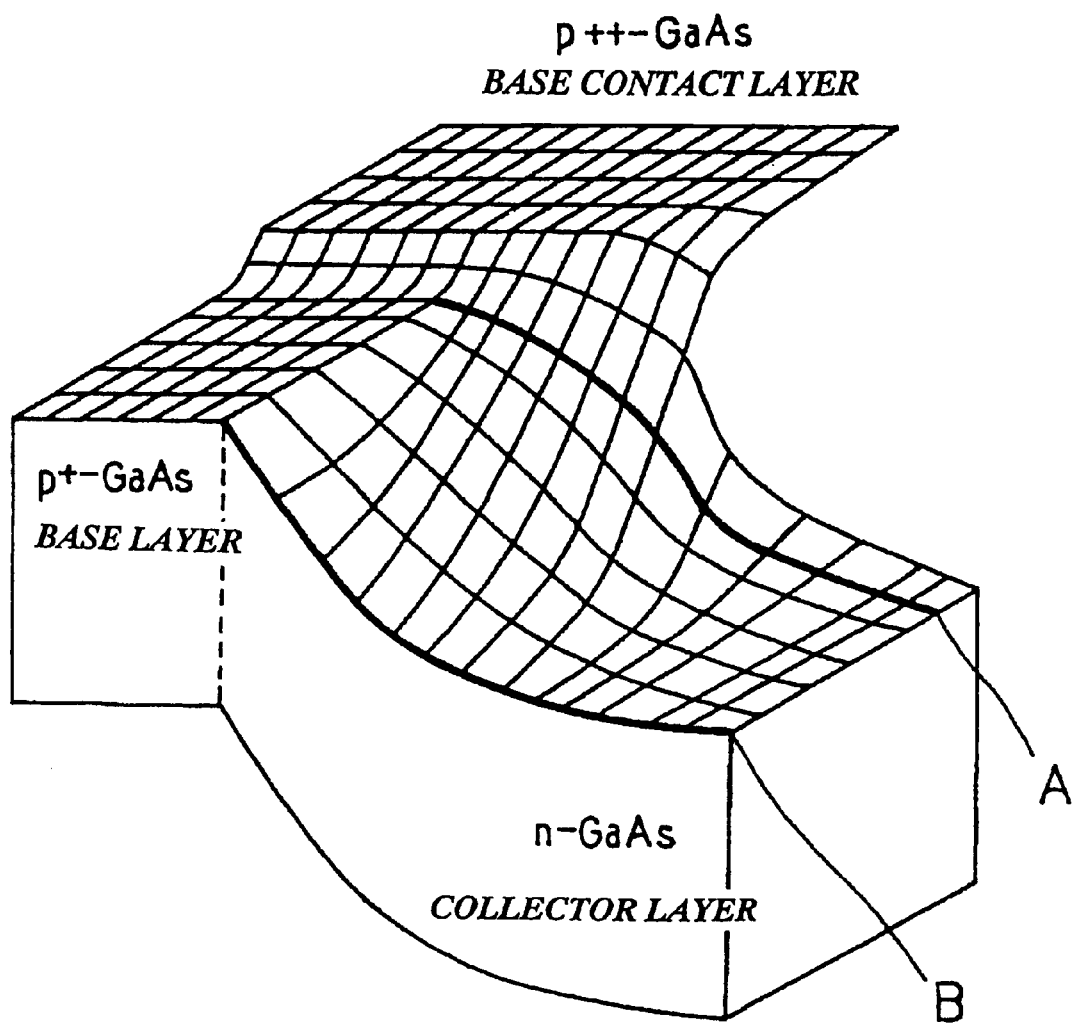
FIG. 12 is a diagram of contour of energy band in base collector region of BT according to the present invention.

FIG. 11 shows band diagram of base collector region of a conventional HBT. Large electric field is created in the base-collector depletion region. In this depletion region, electrons gain energy and transfer from Γ valley to higher energy valley with larger effective mass, such as L valley and X valley. This reduces the electron mobility. FIG. 12 shows band diagram in base-collector region of BT according to the present invention. At its side surface, the base-collector depletion region is covered with a base contact layer of the p-conductive type. Owing to this structure, energy band potential in the depletion region is pulled and lifted toward the region of the p-conductive type. As a result, the intensity of electric field toward the base contact layer has been reduced as compared to the case of FIG. 11, suppressing the electron transfer between valleys. The reduction of intensity of electric field exhibits remarkable effect in area of the depletion region near the base contact layer of the p-conductive type, which is disposed on the side thereof. The remarkable effect becomes less as distance from the base contact layer of the p-conductive type increases. Viewing FIG. 12 after being sectioned along the section A, the intensity of electric field is sufficiently reduced. However, viewing FIG. 12 after being sectioned along the section B, the electric field is almost as strong, in intensity, as the case of conventional base collector structure. In the case of BT that is recently developed anticipating application in areas of millimeter wave band and higher frequency, the elements are miniaturized to the limit set by the present manufacturing technology for enhanced characteristics. The structure, which the present invention is applied to, uses such miniaturized elements. In this case, intrinsic region of element, which electrons passe through, is extremely narrow in width so that the effect after lifting energy potential from the side is good over the entire area of the intrinsic region of the depletion region.

Band diagram in base-collector depletion region can be adjusted to highly detailed contour by varying concentration of the p-conductive type impurity in the base contact layer in a predetermined distribution pattern along depth from the element surface toward the rear. This is an alternative. Gradually changing composition of the base contact layer to change energy band gap is another alternative. Forming the base contact layer with multiple layered structure using different materials is the other alternative.

First Embodiment

Figure 1:
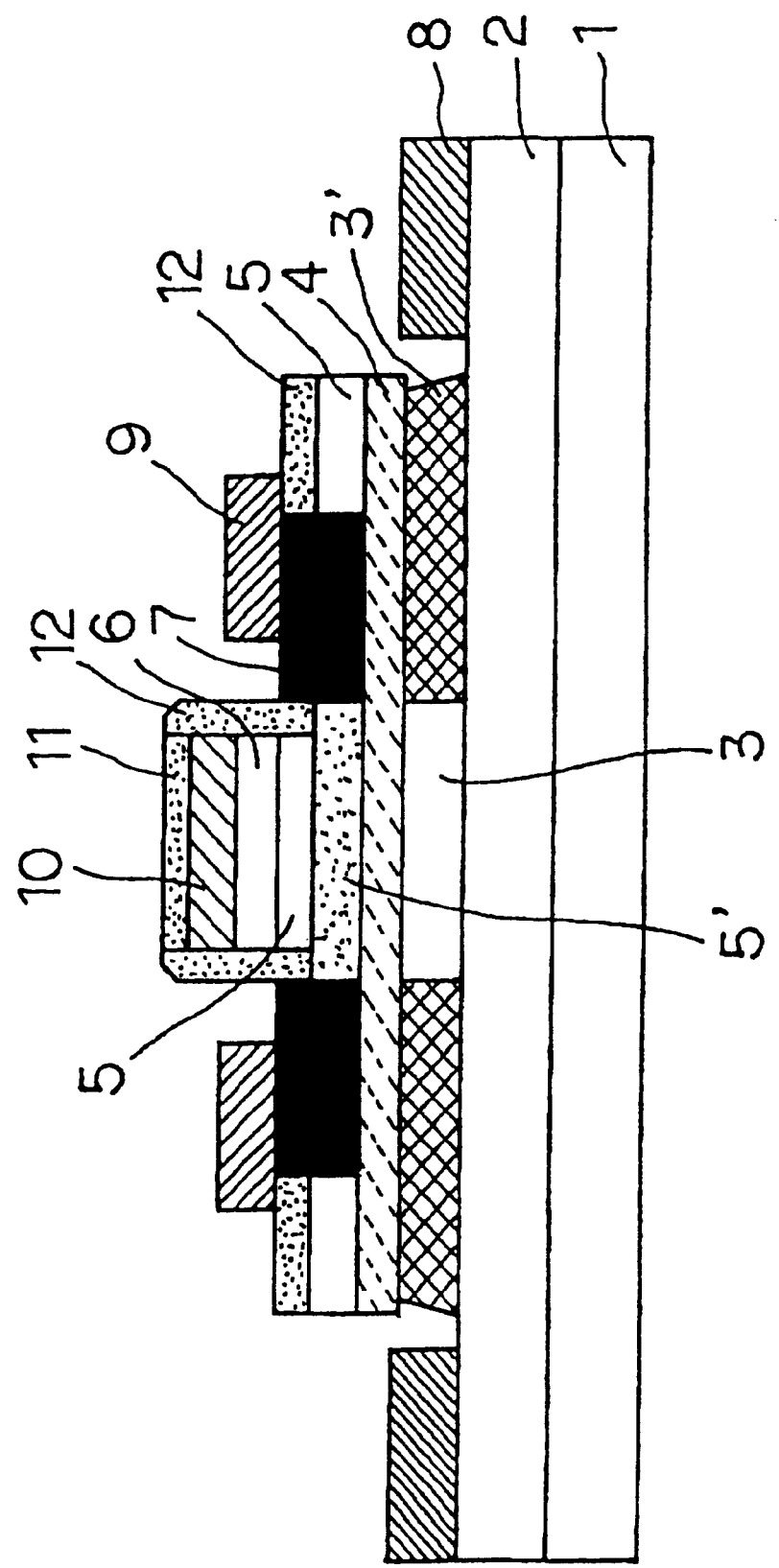
FIG. 1 is a cross sectional diagram of a first embodiment of BT according to the present invention.

FIG. 1 shows a sectional diagram of a first embodiment of a BT according to the present invention. The BT comprises GaAs semi-insulating base 1, n-GaAs emitter contact layer ($3 \times 10^{18}$cm$^{-3}$, 500 nanometers) 2, n-Al$_x$Ga$_{1-x}$As ($0 \leq x \leq 0.25$)/n-Al$_{0.25}$Ga$_{0.75}$As emitter layer ($\times 10^{17}$cm$^{-3}$, 500 nanometers) 3, p-Al$_x$Ga$_{1-x}$As ($0 \leq x \leq 0.1$) base layer of the composition graded type ($4 \times 10^{19}$cm$^{-3}$, 40~80 nanometers) 4, n-GaAs collector layer ($5 \times 10^{16}$cm$^{-3}$, 500 nanometers) 5, n-In$_x$Ga$_{1-x}$As ($0 \leq x \leq 0.5$)/n-In$_{0.5}$Ga$_{0.5}$As collector contact layer 6, p-GaAs base contact layer ($4 \times 10^{20}$ cm$^{-3}$ 300 nanometers) 7, emitter electrode 8, base electrode 9, collector electrode 110, and SiO$_2$ films 11 and 12.

At the edge of a mesa that is formed by the collector contact layer 6 and collector layer 5, the base contact layer 7 is formed on the upper surface of the base layer 4 in contact with the side surface of the collector depletion region 5'. In the embodiment, the BT employs p-Al$_x$Ga$_{1-x}$As ($0 \leq x \leq 0.1$) graded composition in the base layer 4. The material of the base layer 4 is not limited to this example. For example, p-In$_x$Ga$_{1-x}$As($0 \leq x \leq 0.1$), or homogeneous layer of p-GaAs may be used as the material of base layer 4.

In the BT according to the present invention, the adjacent base contact layer lifts energy band in the collector depletion region. Thus, the intensity of electric field in the depletion region is reduced in a direction from the base toward the collector, suppressing transfer of electrons between valleys. This shortens the electron transport time over the depletion region, enhancing high frequency range characteristics.

According to the present invention, usually employed conventional measure to modify the collector layer for suppression of the above-mentioned electron transfer is no longer needed. Thus, the BT is allowed to use a collector layer sufficiently doped with material of the n-conductive type. This suppresses occurrence of Kirk effect.

According to the first embodiment, the base contact layer 7 of p-GaAs is heavily doped with impurity more than the base layer 4 is. In this case, energy potential in conduction band of the base contact layer 7 becomes higher than that in conduction band of the base layer 4. This arrangement prevents electrons from going around the base contact layer 7 region, thus suppressing occurrence of recombination current in the external base layer 4 region. Energy potential in conduction band of the base contact layer 7 may be made higher than that in conduction band of the base layer 4 by forming the base contact layer 7 with p-AlGaAs layer that has great energy band gap.

Making energy potential in conduction band of base contact layer 7 to increase from emitter side toward collector side causes the intensity of electric current in the adjacent collector depletion region to reduce gradually at a rate that is determined by the manner in which the energy potential increases. This is accomplished by employing, as the base contact layer 7, a layer in which impurity concentration becomes condensed at a gradual rate from the emitter side toward the collector side. If desired, the base contact layer 7 may take the form of Al$_x$Ga$_{1-x}$As composition graded layer or In$_x$Ga$_{1-x}$As composition graded layer. If desired, the base contact layer 7 may take double-layer structure of GaAs and ALGaAs or triple-layer structure of InGaAs/GaAs/AlGaAs.

FIGS. 5(a) to 5(e) show the process steps in fabricating the BT shown in FIG. 1.

Figure 5:
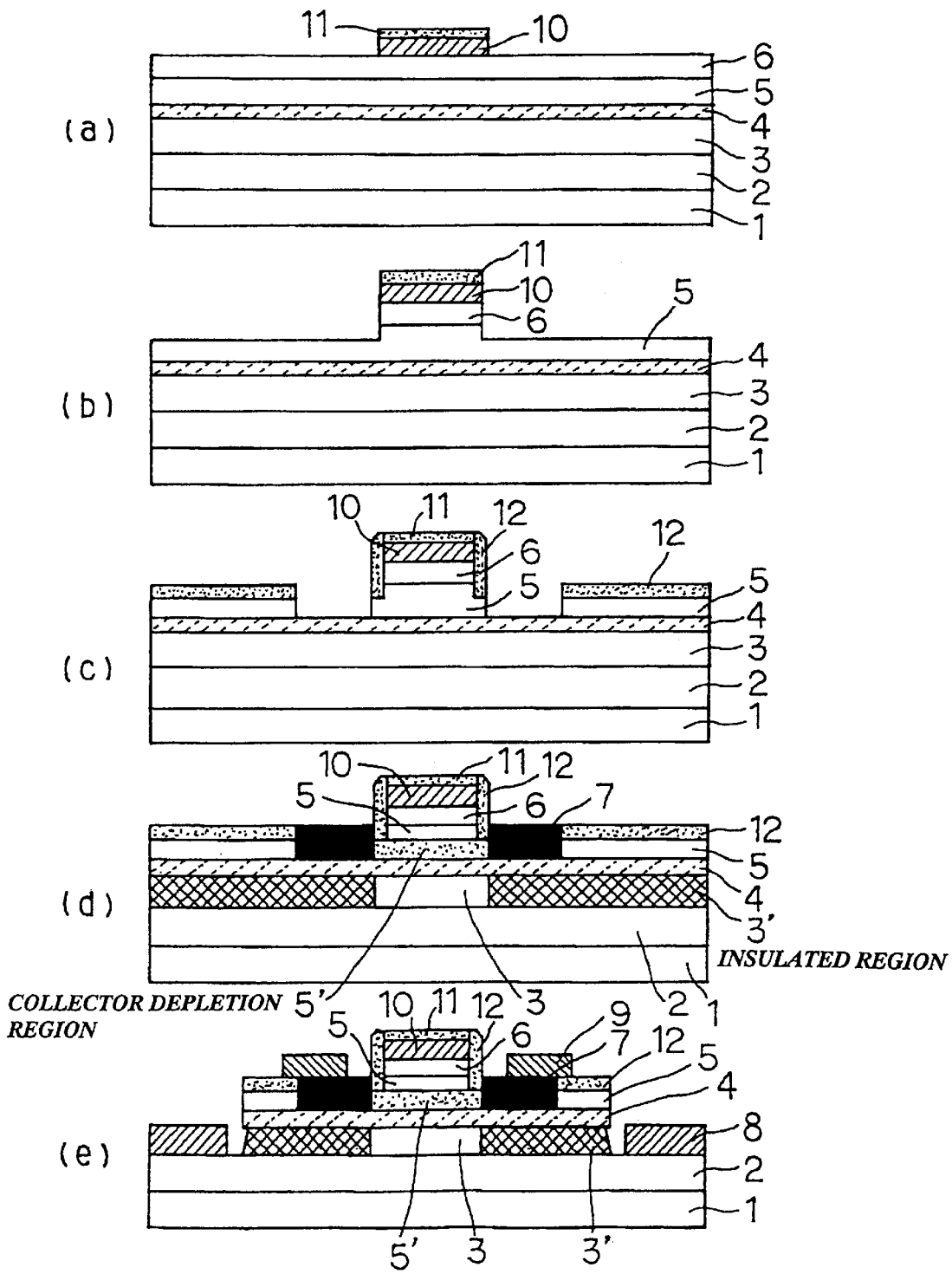
FIGS. 5($a$) to 5($e$) illustrate a fabrication process for the first embodiment shown in FIG. 1.

The process begins in FIG. 5(a) where an emitter contact layer 2 is epitaxially grown on a semi-insulating substrate 1. An emitter layer 3 is epitaxially grown onto the emitter contact layer 2. A base layer 4 is epitaxially grown onto the emitter layer 3. A collector layer 5 is epitaxially grown onto the base layer 4. A collector contact layer 6 is epitaxially grown onto the collector layer 5. A collector electrode 10 is formed on the collector contact layer 6. A SiO$_2$ film 11 is formed on the collector electrode 10.

The process continues in FIG. 5(b) where, with SiO$_2$ film 11 as mask, collector contact layer 6 and portion of collector layer 5 are etched away.

The process continues in FIG. 5(c) where a SiO$_2$ film 12 is formed on the entire surface of the assembly and predetermined portions of the film 12 are removed by reactive ion etching (RIE). A portion of SiO$_2$ film 12 is left as sidewall of mesa that includes collector contact layer 6 and portion of collector layer 5. With the SiO$_2$ film 12 as mask, the exposed crystalline surface is etched away to completely remove the remaining portions of collector layer 5, thus exposing base layer 4.

The process continues in FIG. 5(d) where, with the SiO$_2$ layer 12 as mask, a heavily doped p-GaAs layer 7 is selectively grown by MOMBE onto the exposed upper surface of base layer 4 and the exposed portion of collector layer 5 at the edge of the mesa. Thus, the p-GaAs layer 7 is in contact with side surface of the portion that becomes depletion region 5' in operation of the element. Region of emitter layer 3 that is beneath the external portion of base layer 4 around the mesa is insulated by ion implantation. The insulated region is indicated by the reference numeral 3'.

The process continues in FIG. 5(e) where a base electrode 9 is formed on the p-GaAs layer 7, and an emitter electrode 8 is formed on the surface of the emitter contact layer 2 that has been exposed after etching away portions of layers 12, 5, 4 and 3'. In this manner, the structure of BT shown in FIG. 1 is fabricated.

Second Embodiment

Figure 2:
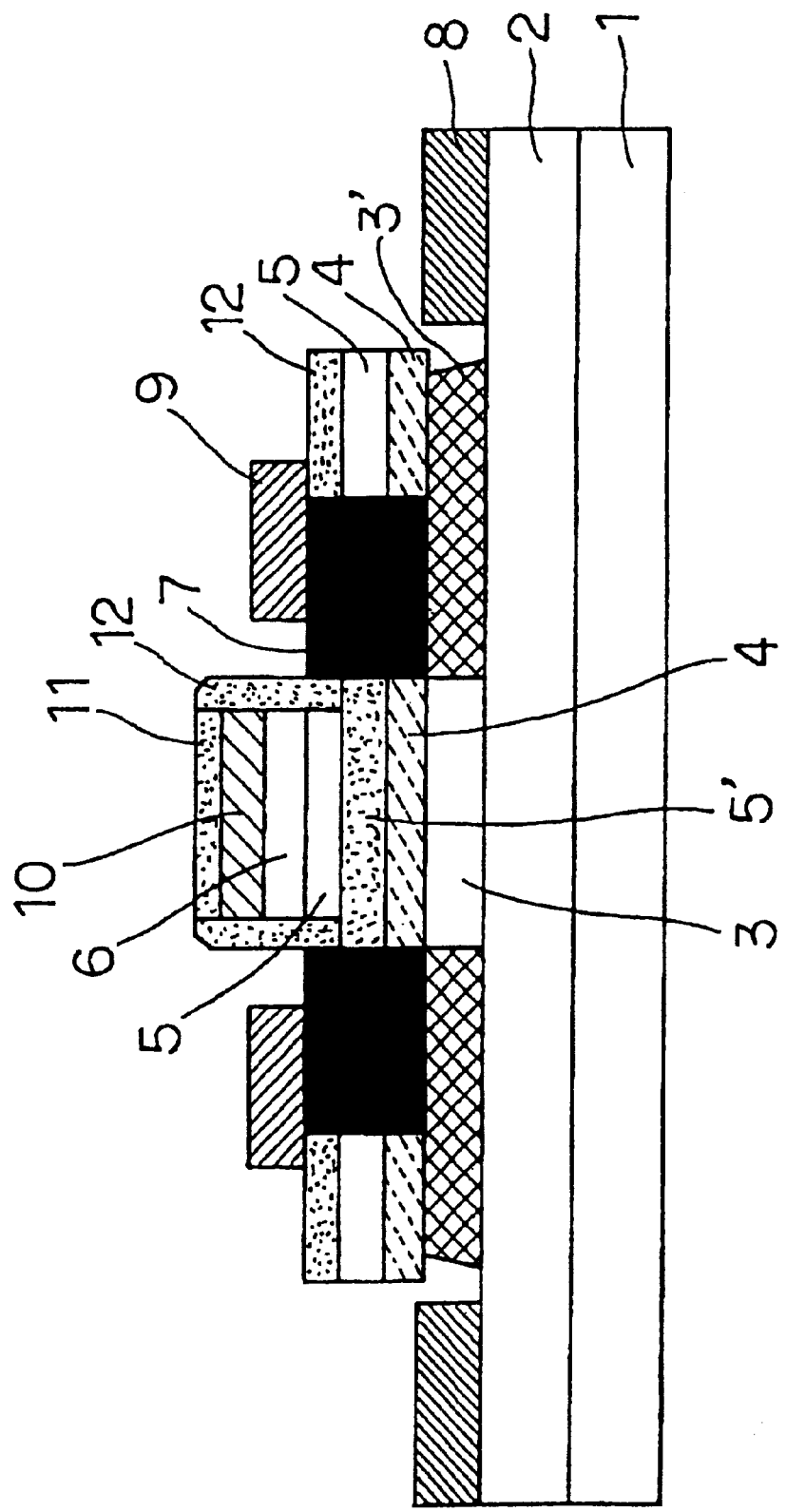
FIG. 2 is a cross sectional diagram of a second embodiment of BT according to the present invention.

FIG. 2 shows a sectional diagram of a second embodiment of a BT according to the present invention. The BT comprises GaAs semi-insulating base 1, n-GaAs emitter contact layer ($3 \times 10^{-18}$cm$^{-3}$, 500 nanometers) 2, n-Al$_x$Ga$_{1-x}$As ($0 \leq x \leq 0.25$)/n-Al$_{0.25}$Ga$_{0.75}$As emitter layer ($3 \times 10^{17}$cm$^{-3}$, 500 nanometers) 3, p-Al$_x$Ga$_{1-x}$As ($0 \leq x \leq 0.1$) base layer of the composition graded type ($4 \times 10^{19}$cm$^{-3}$, 40~80 nanometers) 4, n-GaAs collector layer ($5 \times 10^{16}$cm$^{-3}$, 500 nanometers) 5, n-In$_x$Ga$_{1-x}$As ($0 \leq x \leq 0.5$)/n-In$_{0.5}$Ga$_{0.5}$As collector contact layer 6, p-GaAs base contact layer ($4 \times 10^{20}$cm$^{-3}$, 300 nanometers) 7, emitter electrode 8, base electrode 9, collector electrode 10, and SiO$_2$ films 11 and 12.

At the edge of mesa that is formed by the collector contact layer 6 and collector layer 5, the base contact layer 7 is in contact with the side surface of the base layer 4 and the side surface of the collector depletion region 5'. The base contact layer 7 is formed on the upper surface of the insulated region 3' of the emitter layer 3.

FIGS. 6(a) to 6(e) show the process steps in fabricating the BT shown in FIG. 2.

Figure 6:
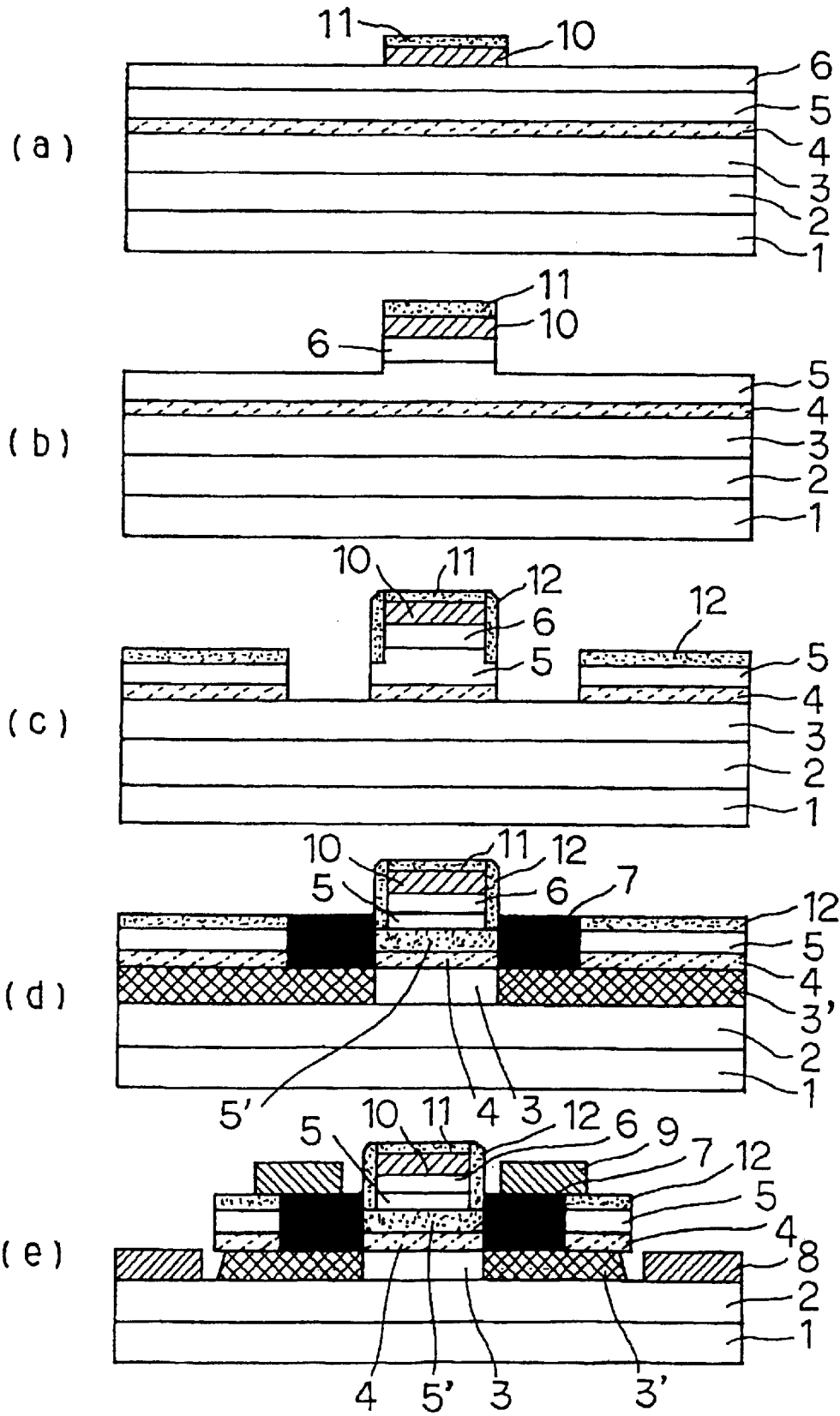
FIGS. 6($a$) to 6($e$) illustrate a fabrication process for the second embodiment shown in FIG. 2.

The process begins in FIG. 6(a) where an emitter contact layer 2 is epitaxially grown on a semi-insulating substrate 1. An emitter layer 3 is epitaxially grown onto the emitter contact layer 2. A base layer 4 is epitaxially grown onto the emitter layer 3. A collector layer 5 is epitaxially grown onto the base layer 4. A collector contact layer 6 is epitaxially grown onto the collector layer 5. A collector electrode 10 is formed on the collector contact layer 6. A $SiO_2$ film 11 is formed on the collector electrode 10.

The process continues in FIG. 6(b) where, with $SiO_2$ film 11 as mask, collector contact layer 6 and portion of collector layer 5 are etched away.

The process continues in FIG. 6(c) where a $SiO_2$ film 12 is formed on the entire surface of the assembly and predetermined portions of the film 12 are removed by reactive ion etching (RIE). A portion of $SiO_2$ film 12 is left as sidewall of mesa that includes collector contact layer 6 and portion of collector layer 5. With the $SiO_2$ film 12 as mask, the exposed crystalline surface is etched away to completely remove the remaining portions of collector layer 5 and the base layer 4, thus exposing emitter layer 3. The process continues in FIG. 6(d) where, with the $SiO_2$ layer 12 as mask, a heavily doped p-GaAs layer 7 is selectively grown by MOMBE onto the exposed upper surface of emitter layer 3, the side surface of base layer 4, and the exposed portion of collector layer 5 at the edge of the mesa. Thus, the p-GaAs layer 7 is in contact with side surface of the portion that becomes depletion region 5' in operation of the element. Region of emitter layer 3 that is beneath the external portion of base layer 4 around the mesa is insulated by ion implantation. The insulated region is indicated by the reference numeral 3'.

The process continues in FIG. 6(e) where a base electrode 9 is formed on the p-GaAs layer 7, and an emitter electrode 8 is formed on the surface of the emitter contact layer 2 that has been exposed after etching away portions of layers 12, 5, 4 and 3'. In this manner, the structure of the BT shown in FIG. 2 is fabricated.

Third Embodiment

Figure 3:
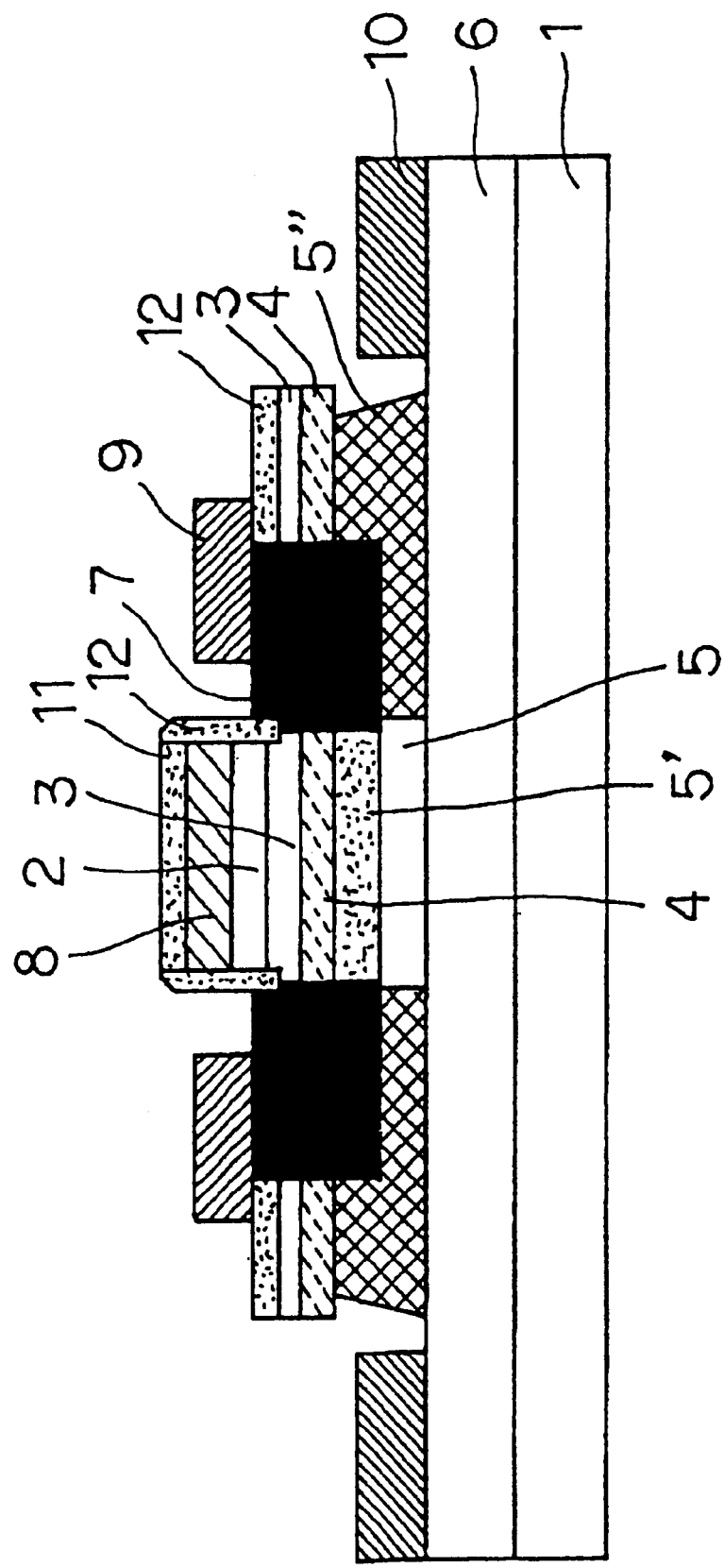
FIG. 3 is a cross sectional diagram of a third embodiment of BT according to the present invention.

FIG. 3 shows a sectional diagram of a second embodiment of a BT according to the present invention. The BT comprises GaAs semi-insulating base 1, n-GaAs collector contact layer ($3\times10^{18}cm^{-3}$, 500 nanomoters) 6, n-GaAs collector layer ($5\times10^{16}cm^{-3}$, 500 nanometers) 5, p-$Al_xGa_{1-x}As$ ($0\leq x\leq 0.1$) base layer of the composition graded type ($4\times10^{19}cm^{-3}$, 40~80 nanometers) 4, n-$Al_{0.25}Ga_{0.75}As$ emitter layer ($3\times10^{17}cm^{-3}$, 500 nanometers) 3, n-$Al_xGa_{1-x}As$ ($0\leq x\leq 0.25$)/n-GaAs/n-$In_xGa_{1-x}As$ ($0\leq x\leq 0.5$)/n-$In_{0.5}Ga_{0.5}As$ emitter cap layer 2, p-GaAs base contact layer ($4\times10^{20}cm^{-3}$, 300 nanometers) 7, emitter electrode 8, base electrode 9, collector electrode 10, and $SiO_2$ films 11 and 12.

Figure 4:
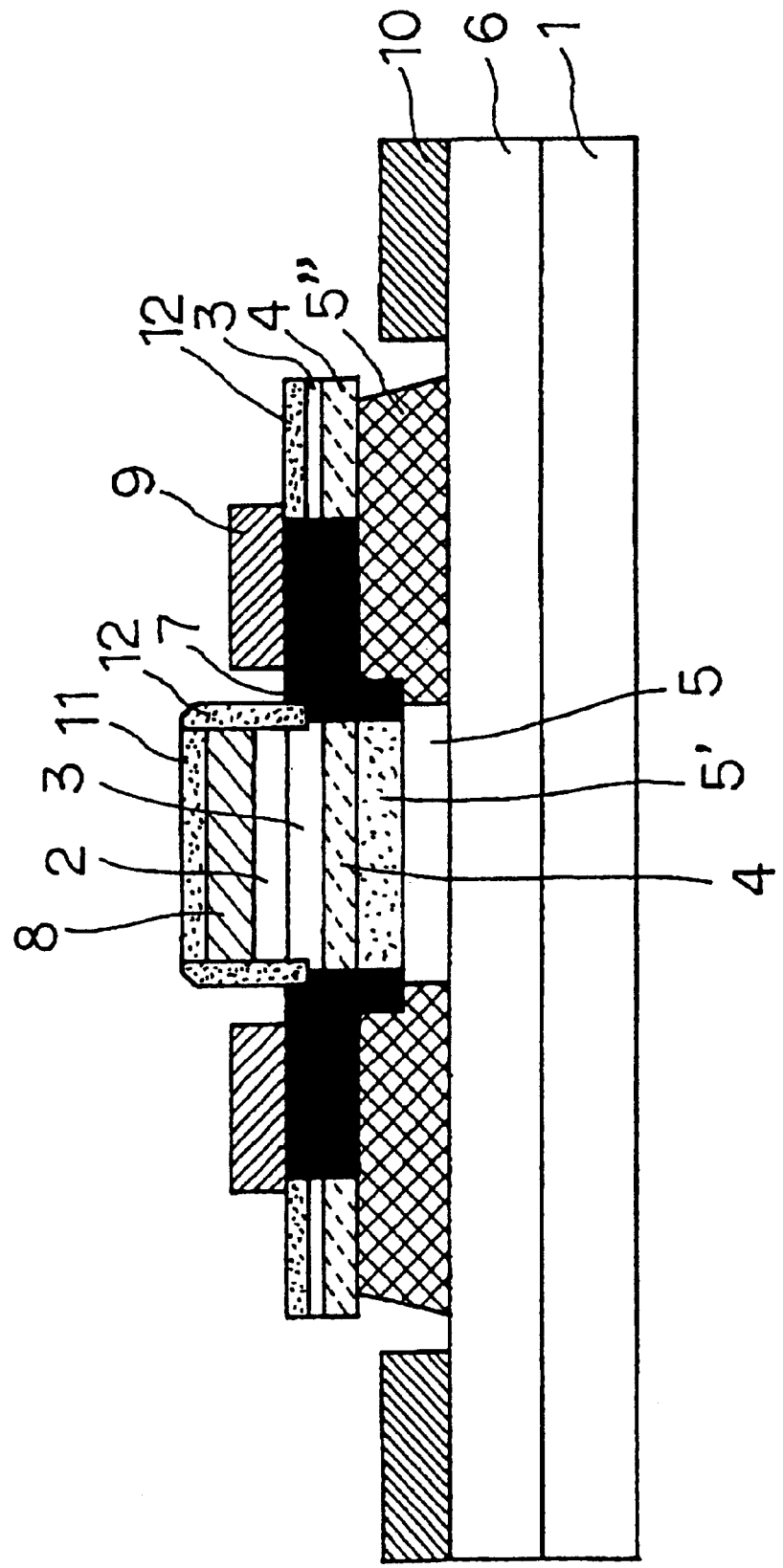
FIG. 4 is a cross sectional diagram of a fourth embodiment of BT according to the present invention.

The emitter cap layer 2, emitter layer 3, base layer 4 and portion of collector layer 5 form a mesa. At the edge of the mesa, the base contact layer 7 is in contact with the side surface of the base layer 4, the side surface of the collector depletion region 5', and the side surface of a portion of the emitter layer 3. The base contact layer 7 is formed on the upper surface of a recessed portion of the insulated region 5" of the collector layer 5. It is to be noted that the base contact layer 7 has lower surface spaced in equidistant from the upper surface of the collector contact layer 6. If desired, capacity between the base and collector can be reduced without reducing the contact area between the collector depletion region 5'. As illustrated in a fourth embodiment shown in FIG. 4, the recessed portion of the insulated region 5" of the collector layer 5 should be confined within a narrow area surrounding the side surface of the collector depletion region 5' as illustrated in FIG. 4. The base contact layer 7 should be grown on the bottom of the recessed portion and also on the upper surface of the insulated region 5" as illustrated in FIG. 4. Except this arrangement, the fourth embodiment is substantially the same as the third embodiment. It will be appreciated that reduction of capacity between the base and collector has been accomplished by increasing distance between the base contact layer 7 and the collector layer 5. Thus, the fourth embodiment is advantageous in high frequency wave characteristics over the third embodiment.

FIGS. 7(a) to 7(e) show the process steps in fabricating the BT shown in FIG. 3.

Figure 7:
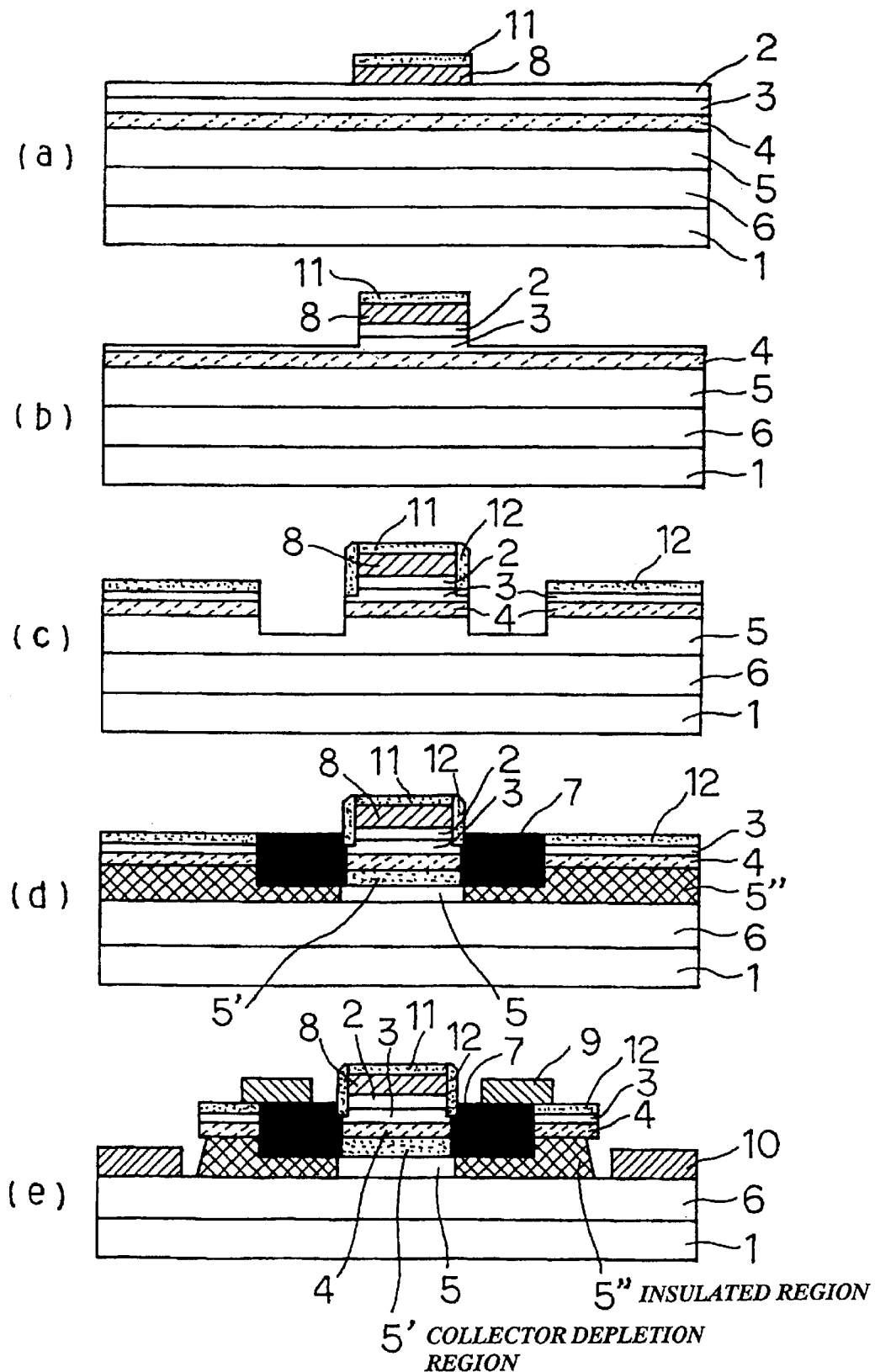
FIGS. 7($a$) to 7($e$) illustrate a fabrication process for the third embodiment shown in FIG. 3.
Figure 8:
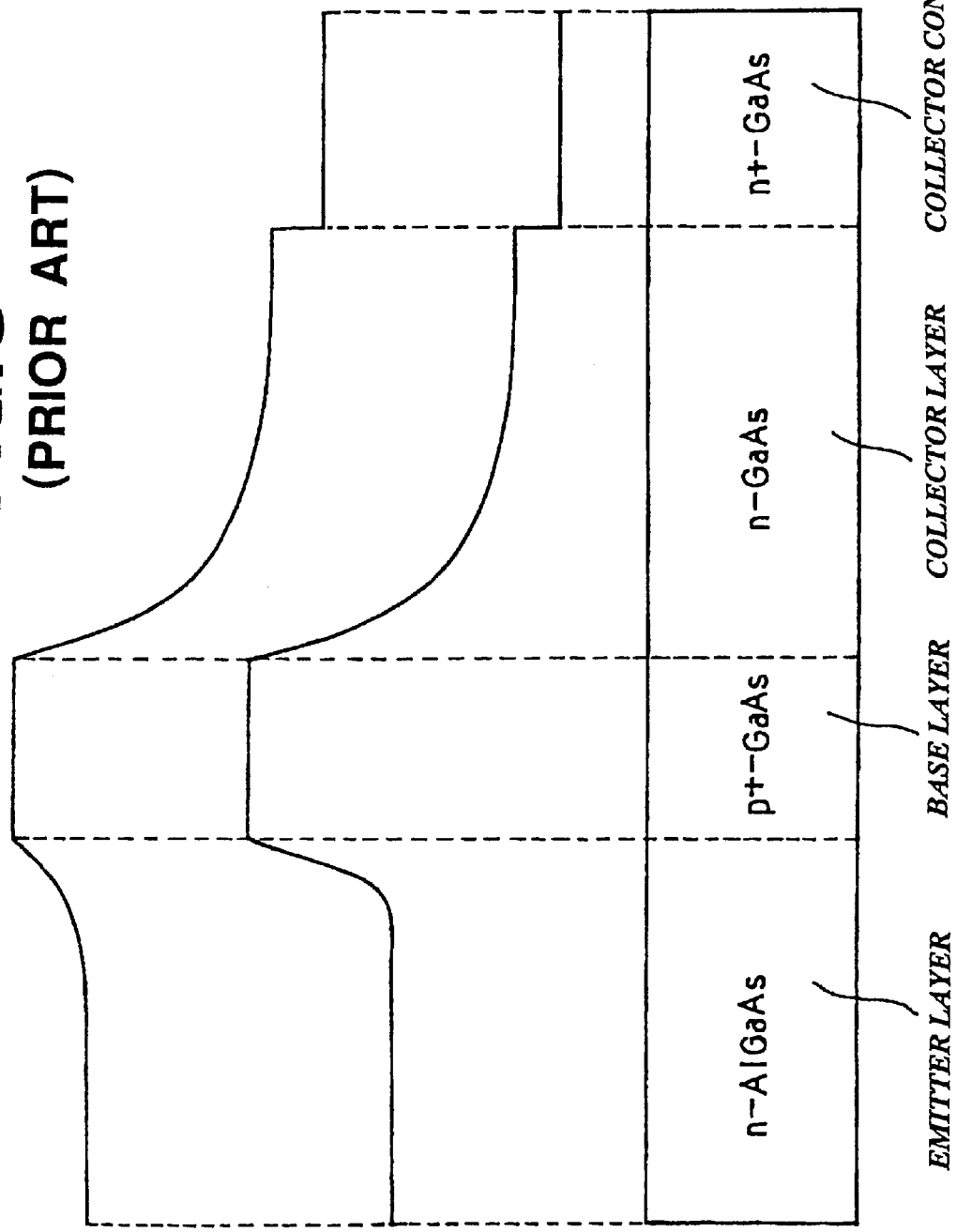
FIG. 8 is band diagram of a conventional HBT.
Figure 9:
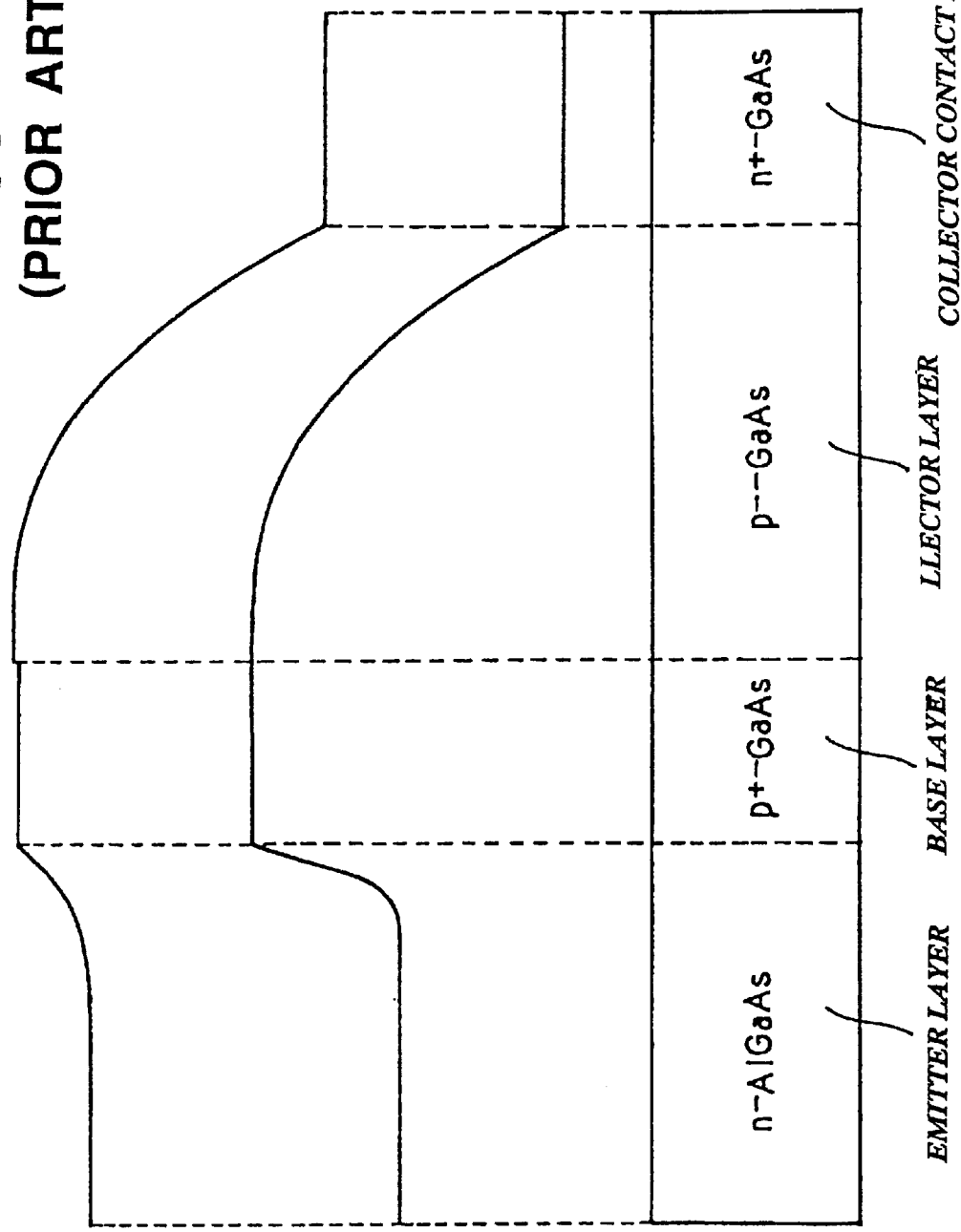
FIG. 9 is band diagram of another conventional HBT.
Figure 10:
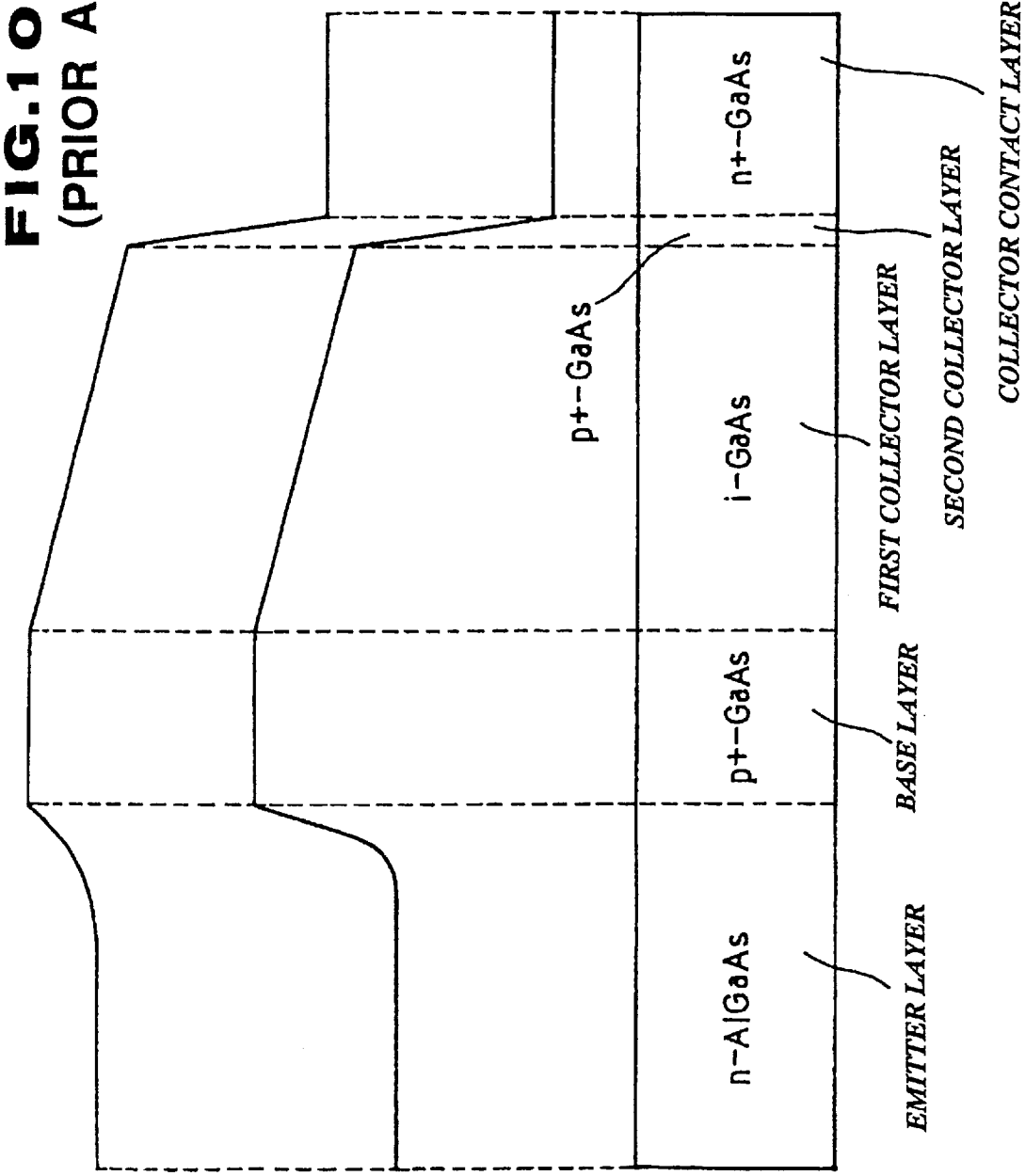
FIG. 10 is band diagram of other conventional HBT.

The process begins in FIG. 7(a) where a collector contact layer 6 is epitaxially grown on a semi-insulating substrate 1. A collector layer 5 is epitaxially grown onto the collector contact layer 6. A base layer 4 is epitaxially grown onto the collector layer 5. An emitter layer 3 is epitaxially grown onto the base layer 4. An emitter contact layer 2 is epitaxially grown onto the emitter layer 3. An emitter electrode 8 is formed on the emitter contact layer 3. A $SiO_2$ film 11 is formed on the emitter electrode 8.

The process continues in FIG. 7(b) where, with $SiO_2$ film 11 as mask, emitter contact layer 2 and portion of emitter layer 3 are etched away.

The process continues in FIG. 7(c) where a $SiO_2$ film 12 is formed on the entire surface of the assembly and predetermined portions of the film 12 are removed by reactive ion etching (RIE). A portion of $SiO_2$ film 12 is left as sidewall of mesa that includes emitter contact layer 2 and portion of emitter layer 3. With the $SiO_2$ film 12 as mask, the exposed GaAs crystalline surface is etched away to completely remove the remaining portions of emitter layer 3, base layer 4, and portion of collector layer 5.

The process continues in FIG. 7(d) where, with the $SiO_2$ layer 12 as mask, a heavily doped p-GaAs layer 7 is selectively grown by MOMBE onto the recessed portion of collector layer 5. The p-GaAs layer 7 is brought into contact with the exposed portion of base layer 4 at the edge of the mesa and side surface of the portion of the collector layer 5 that becomes depletion region 5' in operation of the element. Region of collector layer 5 that is beneath the external portion of base layer 4 around the mesa is insulated by ion implantation. The insulated region is indicated by the reference numeral 5".

The process continues in FIG. 7(e) where a base electrode 9 is formed on the p-GaAs layer 7, and a collector electrode 10 is formed on the surface of the collector contact layer 6 that has been exposed after etching away portions of layers 12, 5, 4 and-3'. In this manner, the structure of the BT shown in FIG. 3 is fabricated.

From the preceding description, it is now understood that energy band potential in collector depletion region is lifted owing to the adjacent base contact layer in contact with the side surface of the depletion region, thus reducing intensity of electric field, suppressing transfer of electrons between valleys. This results in accomplishing ultra high mobility of electrons.

It is appreciated that since energy band potential is lifted in response to increase in base potential, mobility of electrons under high biased condition is not interfered. In other words, energy band potential in the depletion layer is self-adjusted to always provide suitable circumference for ensuring high mobility of electrons.

What is claimed is:

1. A bipolar transistor comprising:

a semi-insulating substrate;

an emitter layer of a first semiconductor with a first conductive type;

a base layer of a second semiconductor with a second conductive type;

a collector layer of a third semiconductor with said first conductive type;

a base electrode; and a base contact layer between said base electrode and said base layer, said base contact layer being formed of a fourth semiconductor with said second conductive type;

said base contact layer being in contact with a depletion region formed between said base layer and said collector layer under biased condition.

2. A bipolar transistor as claimed in claim 1, wherein said base contact layer has a conduction band with first band potential, and said base layer has a conduction band with second band potential, and wherein said first band potential is higher than said second band potential.

3. A bipolar transistor as claimed in claim 2, wherein said base contact layer has a first impurity concentration, and said base layer has a second impurity concentration, and wherein said first impurity concentration is higher than said second impurity concentration.

4. A bipolar transistor as claimed in claim 2, wherein said base contact layer is formed of a first material, and said base layer is formed of a second material, and wherein said first material exhibits energy band gap greater than energy band gap which said second material exhibits.

5. A bipolar transistor as claimed in claim 1, wherein said base contact layer has a conduction band with band potential increasing in gradient in a direction from said emitter layer toward said collector layer.

6. A bipolar transistor as claimed in claim 5, wherein impurity concentration in said base contact layer increases gradually in a direction from the side of said emitter layer toward the side of said collector layer.

7. A bipolar transistor as claimed in claim 5, wherein said base contact layer is formed of material which has graded composition such that energy band gap increases in a direction from the side of said emitter layer toward the side of said collector layer.

8. A bipolar transistor as claimed in claim 5, wherein said base contact layer is of multiple layered structure including at least two semiconductor layers.

* * * * *